(12) United States Patent
Paquin et al.

(10) Patent No.: US 6,424,537 B1
(45) Date of Patent: Jul. 23, 2002

(54) MOUNTING SYSTEM FOR CIRCUIT BOARD

(75) Inventors: David M. Paquin, Cypress; Carl E. Davis, Houston; George Megason, Spring, all of TX (US)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 09/691,534

(22) Filed: Oct. 18, 2000

(51) Int. Cl.[7] .................................................. H05K 5/00
(52) U.S. Cl. ...................... 361/752; 361/759; 361/801; 24/41.17
(58) Field of Search .................... 361/724–726, 361/752, 753, 759, 796–798, 801, 807, 810; 174/138 D, 138 F; 403/24; 211/41.17; 24/547, 563; 248/220.21, 220.22; 206/340–341

(56) References Cited

U.S. PATENT DOCUMENTS

| | | | | |
|---|---|---|---|---|
| 4,712,939 A | * | 12/1987 | Fujimoto | 174/138 D |
| 4,892,431 A | * | 1/1990 | Bachmann et al. | 24/297 |
| 5,281,149 A | * | 1/1994 | Petri | 174/138 D |
| 5,973,926 A | * | 10/1999 | Sacherman et al. | 361/740 |
| 5,978,232 A | * | 11/1999 | Jo | 211/41.17 |
| 6,088,228 A | * | 7/2000 | Petersen et al. | 165/185 |

* cited by examiner

Primary Examiner—Kamand Cuneo
Assistant Examiner—Tuan Dinh
(74) Attorney, Agent, or Firm—Fletcher, Yoder & Van Someren

(57) ABSTRACT

A system for facilitating the mounting of circuit boards within an enclosure. The system includes one or more standoffs that are each received through appropriately formed corresponding openings through a printed circuit board. A flexible clip is attached to the printed circuit board proximate each opening. Each clip includes a retainer portion designed to receive the head of the standoff. Thus, the printed circuit board may be attached to the standoffs simply by placing the circuit board openings over the standoffs and moving the printed circuit board laterally until the clips and standoffs are engaged.

19 Claims, 2 Drawing Sheets

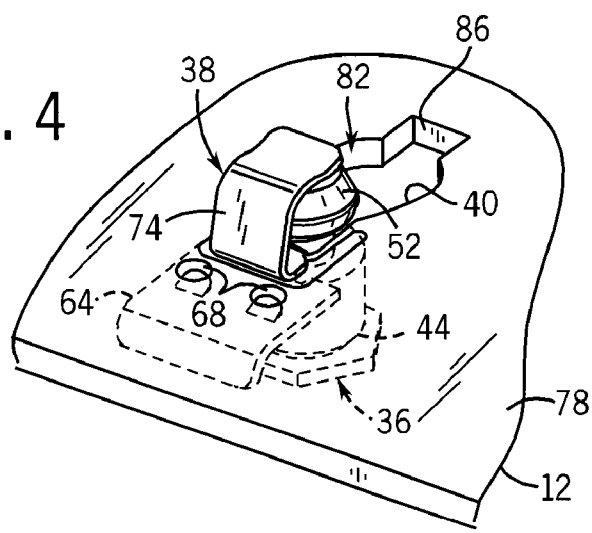
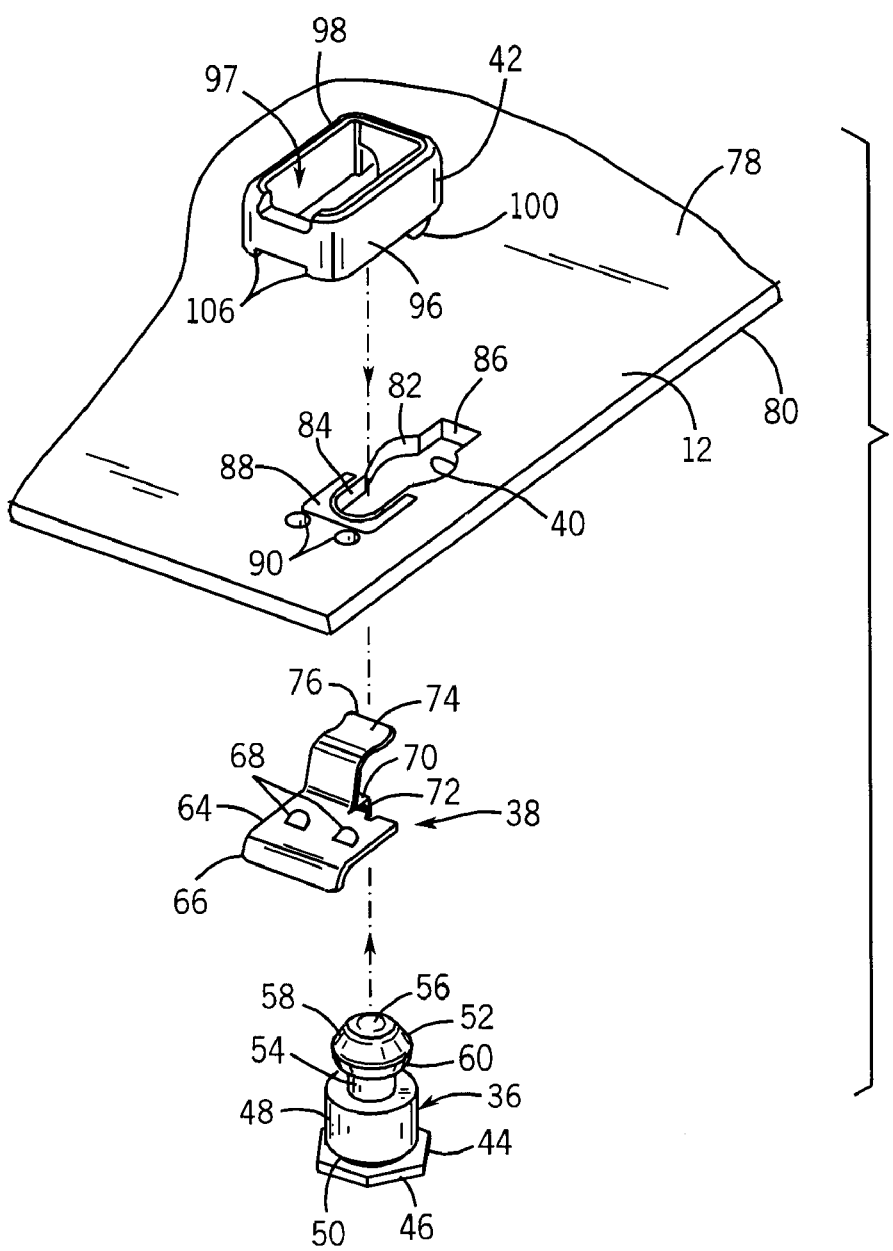

MOUNTING SYSTEM FOR CIRCUIT BOARD

FIELD OF THE INVENTION

The present invention relates generally to a system for mounting circuit boards, and particularly to a system that facilitates the installation, removal and retention of a printed circuit board within an enclosure.

BACKGROUND OF THE INVENTION

Circuit boards, such as printed circuit boards, are used in a variety of devices, such as computers and servers. The electronic device is formed with an enclosure or chassis that includes one or more walls to which standoffs are mounted. The standoffs are designed to receive and support the printed circuit board at a desired spacing from the adjacent wall of the enclosure or chassis. Typically, the printed circuit board is secured to the standoffs by screws that extend through the printed circuit board for threaded engagement with the standoff.

As printed circuit boards have increased in size to accommodate modern applications, a greater number of standoffs and screws have been required for the secure mounting of the boards. However, the insertion or removal of screws is a time-consuming procedure that increases the risk of damage to the circuit board or components mounted on the circuit board. For example, each screw must be tightened by a tool during manufacture, and any slippage or inadvertent movement of the tool can damage the circuit board or its components. Additionally, if screws are dropped or lost in the chassis or on the circuit board, component damage may again be the result.

It would be advantageous to have a secure system for mounting a circuit board while reducing the need for screw-type fasteners.

SUMMARY OF THE INVENTION

The present invention features a system and method for mounting a circuit board, such as a printed circuit board, within an electronic device. The printed circuit board typically is mounted within an enclosure or chassis of, for instance, a personal computer or a server. However, a variety of other devices and applications can benefit from this circuit board mounting system and method.

The system and method utilize a circuit board having one or more openings formed therethrough between the surfaces of the board. The opening or openings are arranged to receive the head of a standoff therethrough. A clip is mounted proximate the opening and is designed to receive the head of the standoff. Typically, the clip is attached to the circuit board along the edge of the opening and includes a retainer portion designed to grip the head of the standoff. Thus, a printed circuit board may simply be placed over the standoffs and slid transversely until the clip retainers engage the standoffs to hold the circuit board.

BRIEF DESCRIPTION OF THE DRAWINGS

The invention will hereafter be described with reference to the accompanying drawings, wherein like reference numerals denote like elements, and:

FIG. 3 is an exploded view of one of the fastening devices illustrated in FIG. 2;

FIG. 4 is a perspective view of one of the fastening devices of FIG. 2 with the printed circuit board installed.

DETAILED DESCRIPTION OF THE PREFERRED EMBODIMENTS

Figure 1:
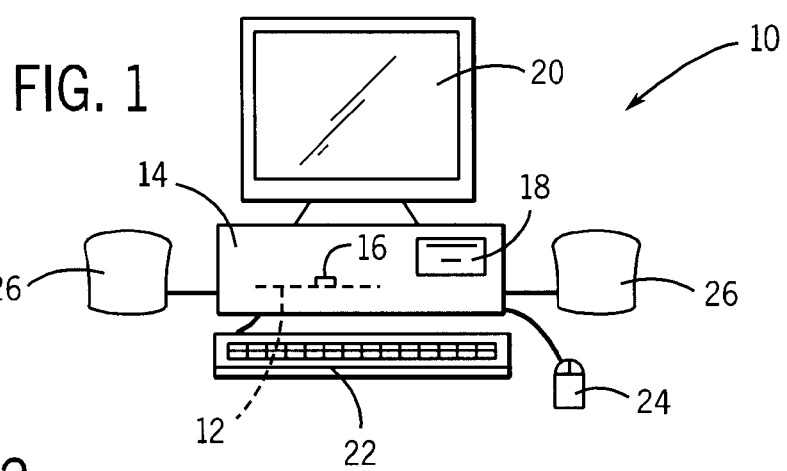
FIG. 1 is a front view of an exemplary electronic device utilizing a printed circuit board.

Referring generally to FIG. 1, an electronic device 10 is illustrated as an exemplary device that would benefit from the present system for mounting a circuit board or boards 12 within a chassis or enclosure 14. Although circuit board 12, e.g. a printed circuit board, may be mounted in a variety of devices, the exemplary device 10 is a personal computer. In this example, enclosure 14 may be utilized to enclose one or more printed circuit boards 12, a microprocessor 16, one or more drives 18, e.g. a CD ROM drive or floppy disk drive, etc. The overall system may include other features, such as a display screen 20, a keyboard 22, a mouse 24 and a pair of speakers 26.

Figure 2:
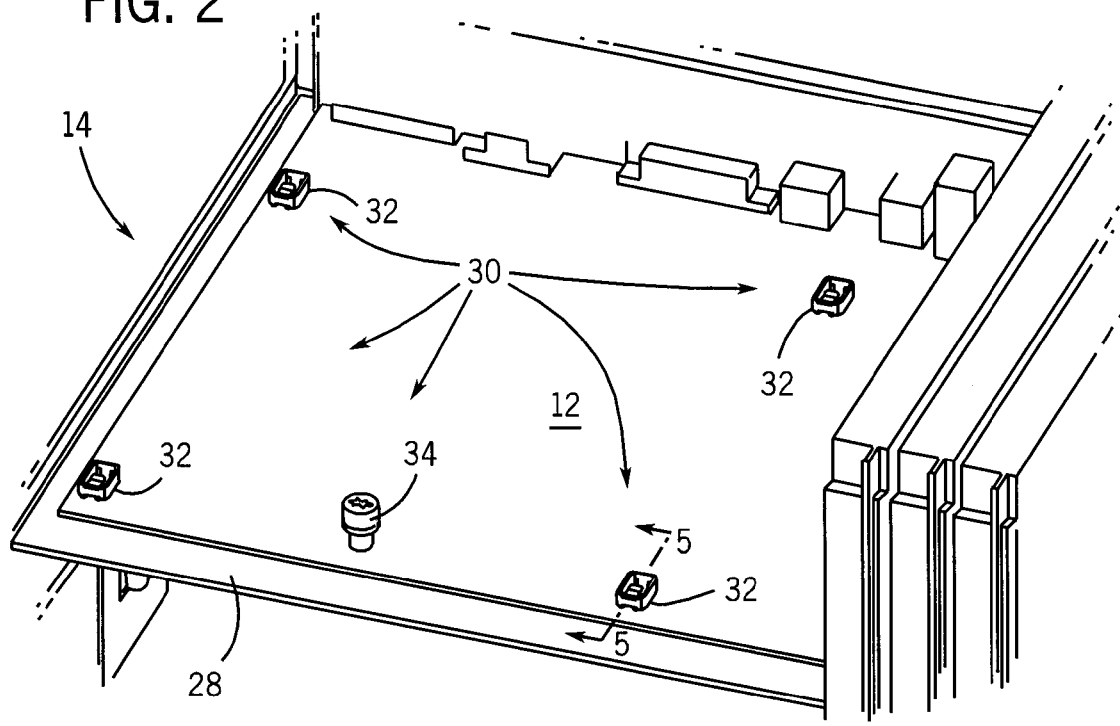
FIG. 2 is a perspective view of the mounting system, according to a preferred embodiment of the present invention, utilized in mounting a printed circuit board within an enclosure.

Regardless of the specific type of device 10, enclosure 14 typically includes a mounting wall 28 to which printed circuit board 12 is mounted via a mounting system 30, as illustrated in FIG. 2. Mounting system 30 includes one or more quick-mount mounting devices 32 that permit a quick installation or removal of circuit board 12 into or from enclosure 14 with minimal risk of lost screws or damaged components.

Optionally, a retention screw 34 may be utilized to further secure circuit board 12 at its installed location. A typical retention screw 34 is disposed through printed circuit board 12 and threadably engaged with an appropriate threaded bore disposed on mounting wall 28. One advantage of utilizing at least one retention screw 34 is that the screw can be used to establish a ground between circuit board 12 and the enclosure or chassis 14.

Details of mounting system 30 and each mounting device 32 are further described with reference to FIGS. 3 and 4. Each mounting mechanism 32 includes a standoff 36, a clip 38 and a corresponding opening 40 disposed through circuit board 12. Additionally, a protection device 42 may be utilized in cooperation with standoff 36, clip 38 and opening 40 to provide protection against damage to the mounting system due to inadvertent contact during installation or removal of printed circuit board 12.

Standoff 36 includes a base portion 44 that has a flange 46 designed to retain the standoff in mounting wall 28, as known to those of ordinary skill in the art. Base portion 44 also includes a cylindrical barrel portion 48 and a recess 50 disposed between barrel portion 48 and flange 46. Recess 50 is designed for receipt of material that may be deformed when standoff 36 is pressed into mounting wall 28.

Standoff 36 also includes a head portion 52 and an annular recessed area or neck 54. Head portion 52 includes a generally flat top 56, an upper section 58 that slopes generally downwardly and outwardly from flat top 56, and a lower section 60. Lower section 60 slopes upwardly and radially outwardly from a generally planar lower surface 62 (see FIG. 5) to upper section 58. In one exemplary embodiment, the outer surface of upper section 58 slopes downwardly at approximately a 45° angle from the plane containing generally flat top 56. Similarly, the outer surface of lower section 60 slopes upwardly at approximately a 45° angle from a plane containing lower surface 62.

Clip 38 preferably is a flexible clip made from a conductive, metallic material, such as beryllium copper. Clip 38 may easily be formed by shearing and forming a sheet metal blank.

In the illustrated embodiment, clip 38 includes a base 64 having a downturned lip 66 that facilitates installation and removal of clip 38 from circuit board 12. A retention portion 68, such as the illustrated pair of tabs may also be formed from base 64 to aid in the retention of clip 38 on circuit board 12. Although retention member 68 can be formed from other portions of clip 38, a pair of sheer formed tabs extending upwardly in a generally opposite direction from lip 66 may be readily formed and utilized in retaining clip 38 on circuit board 12.

Figure 5:
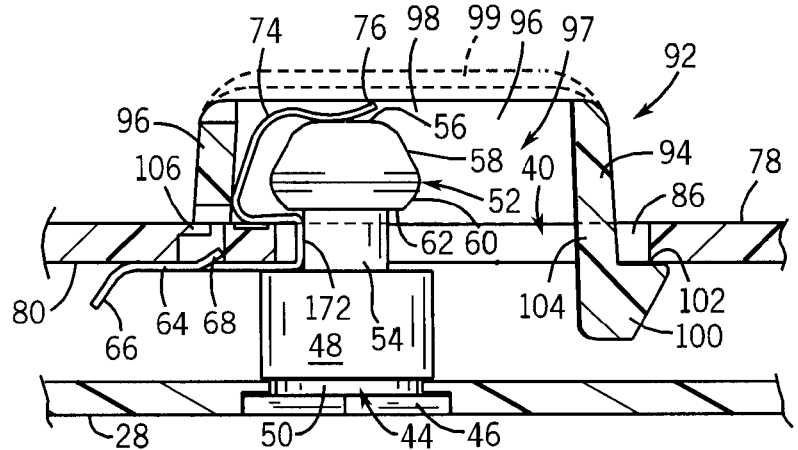
FIG. 5 is a cross-sectional view of one of the fastening devices taken generally along 5—5 of FIG. 2.

Clip 38 also includes a stabilizer wall 70 disposed generally parallel with base 64 and connected to base 64 by a neck 72. Neck 72 is designed to extend through opening 40. A retainer portion 74 is connected to stabilizer wall 70 and comprises a wall that extends generally away from stabilizer wall 70 and arcs into generally parallel alignment with stabilizer wall 70 such that head portion 52 of standoff 36 may be received and gripped therein. Specifically, stabilizer wall 70 is disposed along lower surface 62 of head portion 52, and the upper portion of retainer 74 is disposed along flat top 56 when circuit board 12 is installed, as illustrated in FIGS. 4 and 5. To facilitate insertion of head portion 52 into retainer 74, a leading edge or lip 76 of retainer 74 may be upturned, as best illustrated in FIG. 5.

Opening 40 extends through circuit board 12 from a top surface 78 to a bottom surface 80. (The use of the terms "top" and "bottom" are for reference only, because the circuit board 12 can be positioned in a variety of orientations). Each opening 40 preferably is generally in the form of a keyhole having an expanded central section 82 and a narrower engagement section 84. Additionally, opening 40 may also include a generally rectangular section 86 extending from expanded central section 82 in a direction generally opposite that of engagement section 84. Expanded central section 82 is sized to receive head portion 52 therethrough. Engagement section 84, on the other hand, is sized to receive recessed area 54 of standoff 36. Once the expanded central section of opening 40 is placed over a corresponding standoff 36 and circuit board 12 is moved laterally, engagement section 84 is disposed around recessed area 54, as illustrated in FIGS. 4 and 5. Engagement section 84 is narrower than the diameter of cylindrical barrel portion 48 and head portion 52 to prevent axial movement of circuit board 12 once clip 38 is moved into engagement with head portion 52.

Expanded central section 82 also is sized to receive retainer 74 therethrough when clip 38 is inserted into opening 40 and clipped to circuit board 12, as illustrated in FIG. 5. After retainer 74 is inserted through expanded central section 82, clip 38 is moved into engagement section 84 until stabilizer wall 70 lies along top surface 78 and base 64 lies along bottom surface 80 to grip circuit board 12 therebetween. Neck 72 remains extended through engagement section 84 of opening 40. Preferably, a grounding patch 88 is disposed along one or both of top surface 78 and bottom surface 80 proximate engagement section 84. The grounding patch or patches 88 are located to form contact with either or both of stabilizer wall 70 and base 64 when clip 38 is connected to circuit board 12.

Additionally, circuit board 12 preferably includes an abutment feature 90 that cooperates with retention mechanism 68 to further retain clip 38 on circuit board 12. In the illustrated embodiment, abutment feature 90 includes a pair of holes disposed through printed circuit board 12 at a location such that the pair of tabs forming the exemplary retention member 68 are received in the holes once clip 38 is installed. The cooperating tabs and holes ensure that force must be exerted against lip 66 to move base 64 away from bottom surface 80 prior to removal of clip 38.

As best illustrated in FIG. 5, mounting devices 32 preferably are surrounded by a protective system 92 that includes individual protective housings 94. Each housing 94 is designed to fit around the portion of a corresponding mounting device 32 that extends above top surface 78 of circuit board 12.

In the illustrated embodiment, housing 94 includes a sidewall 96 that forms an opening or recess 97. Sidewall 96 extends completely around head portion 52 and retainer 74 upon installation of circuit board 12 onto standoffs 36. Housing 94 also may include an open top 98 in communication with opening 97 to facilitate visibility of standoffs 36 during installation of circuit board 12. Alternatively, housing 94 may include a solid or closed top 99, as illustrated by dashed lines in FIG. 5. If the closed top design is used, the top area preferably is generally transparent to promote visibility.

Housing 94 preferably is removably connected to printed circuit board 12, and this can be accomplished in a variety of ways. In the exemplary embodiment, wall 96 is sized such that the bottom of the wall contacts top surface 78 of circuit board 12 when installed. The bottom of wall 96 is held against top surface 78 by a hook portion 100 that extends downwardly from the bottom of wall 96. Hook portion 100 includes a catch 102 designed to engage bottom surface 80 of circuit board 12. Catch 102 is connected to wall 96 by an extension 104 that is sized and located to fit within rectangular section 86 of opening 40 when protective system 92 is installed. Thus, extension 104 extends through rectangular section 86 and catch 102 grips the bottom surface 80 of circuit board 12 to retain housing 94 in place about opening 40. Preferably, wall 96, extension 104 and catch 102 are integrally molded from a material, such as plastic.

Additionally, other catch mechanisms may be utilized to further secure housing 94 to circuit board 12. For example, a pair of tabs 106 may be designed for insertion into the openings of abutment 90 for engagement with the interior surface when housing 94 is installed.

The overall mounting system and protection system can readily be utilized for the safe and secure installation and removal of a circuit board to and from enclosure 14. The process simply includes installing clip 38 to circuit board 12 by inserting the clip into opening 40 and sliding the clip laterally until retention member 68 engages abutment 90 and a portion of circuit board 12 is disposed between stabilizer wall 70 and base 64. This process is repeated for each corresponding clip 38 and opening 40.

Similarly, each housing 94 of protective system 92 is snapped in place about each corresponding clip 38 and opening 40. The open top 98 (or a clear solid top 99) of housing 94 permits circuit board 12 to be aligned over corresponding standoffs 36 such that the circuit board may be lowered until each head portion 52 extends through the expanded central section 82 of each corresponding opening 40.

At this point, circuit board 12 is moved laterally so that the recessed area 54 of each standoff moves into the engagement section 84 of each opening 40. Simultaneously, the head portion 52 of each standoff moves into engagement with retainer 74 of each clip 38. The clips 38 cooperate to securely grip corresponding head portions and hold circuit board 12 in place. Removal of the circuit board requires simple reversal of the installation steps. Also, if greater mechanical or grounding security is desired, retention screw 34 may be inserted through circuit board 12 and threadably engaged with mounting wall 28, as illustrated in FIG. 2.

It will be understood that the foregoing description is of preferred embodiments of this invention, and that the invention is not limited to the specific forms shown. For example, a variety of materials may be utilized in forming the clips and protective housings. The design and arrangement of both the standoffs and the openings through the circuit board can be adjusted, and the clips may be adapted to particular standoff designs. These and other modifications may be made in the design and arrangement of the elements without departing from the scope of the invention as expressed in the appended claims.

What is claimed is:

1. A mounting system for a printed circuit board, comprising:
   a printed circuit board having an opening formed therethrough between a first board surface and a second board surface;
   a flexible clip having a base disposed along the second board surface, a neck extending through the opening, a stabilizer portion disposed along the first board surface, and a retainer; and
   a stand-off having a head sized for insertion through the opening and retention by the retainer.

2. The mounting system as recited in claim 1, wherein the printed circuit board further includes an abutment and the flexible clip includes a tab located to engage the abutment and prevent inadvertent removal of the flexible clip from the printed circuit board.

3. The mounting system as recited in claim 2, wherein the flexible clip is formed of a metal material.

4. The mounting system as recited in claim 2, wherein the stand-off includes an annular recessed portion below the head.

5. The mounting system as recited in claim 4, wherein the head includes a generally flat top.

6. The mounting system as recited in claim 5, wherein a lower portion of the head is disposed at an angle extending away from the annular recessed portion.

7. The mounting system as recited in claim 4, wherein the printed circuit board includes a ground patch disposed adjacent the opening.

8. The mounting system as recited in claim 1, wherein the abutment is formed by a pair of holes and the tab includes a pair of tabs.

9. The mounting system as recited in claim 8, wherein the base of the clip includes a lip to facilitate movement.

10. The mounting system as recited in claim 1, wherein the opening is generally in the shape of a keyhole. of the clip along the printed circuit board.

11. The mounting system as recited in claim 1, wherein the stabilizer portion and the retainer grip the head.

12. A mounting system for mounting a printed circuit board in an enclosure, comprising:
    an enclosure mounting wall;
    a plurality of standoffs extending from the enclosure mounting wall;
    a printed circuit board having a plurality of openings arranged to receive the plurality of standoffs; and
    a plurality of clips mounted proximate corresponding openings of the plurality of openings, each clip includes a base portion and a stabilizer portion disposed to grip the printed circuit board therebetween, each clip having a retainer configured to grip a corresponding standoff of the plurality of standoffs.

13. The mounting system as recited in claim 12, wherein each standoff includes a head and an annular recessed portion intermediate the head and the enclosure mounting wall.

14. The mounting system as recited in claim 12, wherein each clip is formed of single piece of sheet metal.

15. The mounting system as recited in claim 12, wherein each clip includes at least one tab extending from the base portion to engage the printed circuit board and retain the clip in place.

16. The mounting system as recited in claim 15, wherein the printed circuit board includes a tab opening proximate each of the plurality of openings for receiving the at least one tab.

17. The mounting system as recited in claim 12, wherein the head of each standoff includes a generally flat top and a sloped bottom portion.

18. The mounting system as recited in claim 12, wherein each opening of the plurality of openings is generally in the shape of a keyhole.

19. The mounting system as recited in claim 12, further comprising a retention screw disposed through the printed circuit board.

\* \* \* \* \*